(12) United States Patent
Nayfeh et al.

(10) Patent No.: US 9,385,293 B1
(45) Date of Patent: Jul. 5, 2016

(54) QUANTUM MEMORY DEVICE AND METHOD

(71) Applicant: The United States of America as represented by the Secretary of the Navy, Washington, DC (US)

(72) Inventors: Osama Nayfeh, San Diego, CA (US); Anna Leese De Escobar, San Diego, CA (US); Kenneth Simonsen, San Diego, CA (US)

(73) Assignee: THE UNITED STATES OF AMERICA AS REPRESENTED BY THE SECRETARY OF THE NAVY, Washington, DC (US)

( * ) Notice: Subject to any disclaimer, the term of this patent is extended or adjusted under 35 U.S.C. 154(b) by 0 days.

(21) Appl. No.: 14/716,629

(22) Filed: May 19, 2015

Related U.S. Application Data

(63) Continuation-in-part of application No. 14/601,905, filed on Jan. 21, 2015.

(51) Int. Cl.
*H01L 27/18* (2006.01)
*H01L 39/22* (2006.01)

(52) U.S. Cl.
CPC ............ *H01L 39/221* (2013.01); *H01L 27/18* (2013.01); *H01L 39/223* (2013.01)

(58) Field of Classification Search
CPC ...... H01L 27/18; H01L 39/221; H01L 39/223
See application file for complete search history.

(56) References Cited

U.S. PATENT DOCUMENTS

| 5,477,061 A * | 12/1995 | Morohashi | H01L 39/223 257/31 |
| 7,135,701 B2 | 11/2006 | Amin et al. | |
| 7,977,668 B2 * | 7/2011 | Nevirkovets | B82Y 10/00 257/30 |
| 9,082,927 B1 * | 7/2015 | Pramanik | H01L 39/2493 |

OTHER PUBLICATIONS

Du, J. et al., "Fabrication and Characterisation of Series YBCO Step-Edge Josephson Junction Arrays", Superconducting Science and Technology, IOP Publishing, vol. 27, pp. 1-7, 2014.

(Continued)

*Primary Examiner* — Jeffrey Zweizig
(74) *Attorney, Agent, or Firm* — SPAWAR Systems Center Pacific; Kyle Eppele; Ryan J. Friedl

(57) ABSTRACT

A system and method involve generating an electric field across a superconductor device having an ionic layer disposed between and separated from first and second superconductor layers by respective first and second barrier layers. The electric field may be generated by applying an input signal, such as a voltage, to the superconductor device while the device is in a superconducting state. The voltage may be below a threshold voltage for inducing ion transport within the ionic layer or may be above or below a threshold voltage for inducing ion transport from the ionic layer across an ionic layer/barrier layer interface. The ion transport may tune the potential profile and/or modulate the critical current of the superconductor device and may include quantum coherent ionic transport, Josephson tunneling, or resonant tunneling. The electric field generated across the superconductor device may alter the spin-states of the ions within the ionic layer.

20 Claims, 9 Drawing Sheets

(56) References Cited

OTHER PUBLICATIONS

Tolpygo, S, et al., "Fabrication-process-induced variations of NB/Al/AlOx/Nb Josephson junctions in superconductor integrated circuits", Superconductor Science and Technology, IOP Publishing, vol. 24, pp. 1-9, 2010.
Stewart, W.C., "Current-Voltage Characteristics of Josephson Junctions", Applied Physics Letters, vol. 12, No. 8, pp. 277-280, Apr. 1968.
Gheewala, Tushar, "The Josephson Technology", Proceedings of the IEEE, vol. 70, No. 1, pp. 26-34, Jan. 1982.
Clement, P.-Y. et al., "Double barrier magnetic tunnel junctions with write/read mode select layer", 2014 IEEE 6th International Memory Workshop, Tapei, Taiwan, pp. 1-4, May 18-21, 2014.
Baek, B. et al., "Magnetic barrier structures for superconducting-magnetic hybrid Josephson junctions", 2013 IEEE 14th International Superconductive Electronics Conference, Cambridge, MA, pp. 1-3, Jul. 7-11, 2013.
Holmes, D.S. et al., "Energy-Efficient Superconducting Computing—Power Budgets and Requirements," IEEE Transactions on Applied Superconductivity, vol. 23, No. 3, Jun. 2013.
Harris, R. et. al, "Experimental investigation of an eight-qubit unit cell in a superconducting optimization processor," Phys. Rev. B, vol. 82, 024511, 2010.
Mukhanov, O. A., "Energy-efficient Single Flux Quantum technology," IEEE Trans. Appl. Supercond., 21, Jun. 2011.
Nayfeh, O.M. et. al "Memory effects in metal-oxide-semiconductor capacitors incorporating dispensed highly monodisperse 1 nm silicon nanoparticles," Applied Physics Letters, vol. 90, No. 15, Apr. 2007.
Berggren, S. et. al, "Development of 2-D Bi-SQUID Arrays With High Linearity," IEEE Transactions on Applied Superconductivity, vol. 23, No. 3, Jun. 2013.
Mitchell, E.E. et al., YBCO step-edge junctions with high IcRn, Superconductor Science and Technology, vol. 23, 2010, 065007.
Akaike, H., "Characterization of NbN Tunnel Junctions With Radical-Nitrided AlNx Barriers," IEEE Transactions on Applied Superconductivity, vol. 23, No. 3, Jun. 2013.
Satoh, K. et al., "Fabrication Process of Planarized Multi-Layer Nb Integrated Circuits," IEEE Transactions on Applied Superconductivity, vol. 15, No. 2, Jun. 2005.
Kerber, G. et al., "Fabrication of High Current Density Nb Integrated Circuits Using a Self-Aligned Junction Anodization Process," IEEE Transactions on Applied Superconductivity, vol. 13, No. 2, Jun. 2003.
Meckbach, J.M. et al., "Sub-um Josephson Junctions for Superconducting Quantum Devices," IEEE Transactions on Applied Superconductivity, vol. 23, No. 3, Jun. 2013.
Chen, K. et al., "High-Jc MgB2 Josephson junctions with operating temperature up to 40K," Applied Physics Letters, vol. 96, 042506, 2010.
Seto, J. et al., "Supercurrent Tunneling Junctions and Tellurium Barriers," Applied Physics Letters, vol. 19, No. 11, pp. 488-491, Dec. 1971.
Kuprianov, M.Y., et al., "Influence of boundary transparency on the critical current of 'dirty' SS'S structures," Sov. Phys. JETP, vol. 67, No. 6, pp. 1163-1168, Jun. 1988.
Strukov, D.B. et al., "Exponential ionic drift: fast switching and low volatility of thin film memristors," Appl Phys A, vol. 94, pp. 515-519, 2009.
Rose-Innes, A.C. et al., "Superconductivity of Superimposed Metals," Phys. Rev. Lett. Vo. 7, No. 7, 278-279 (1961).
Kleinasser, A.W. et al., "Semiconductor Heterostructure Weak Links for Josephson and Superconducting FET Applications," IEEE Transactions on Magnetics, vol. Mag-23, No. 2, Mar. 1987.

\* cited by examiner

QUANTUM MEMORY DEVICE AND METHOD

CROSS REFERENCE TO RELATED APPLICATIONS

This application is a continuation-in-part of U.S. patent application Ser. No. 14/601,905, filed on Jan. 21, 2015, entitled "Data Storage Method Based on Quantum Memory Array Characteristics," the entire content of which is fully incorporated by reference herein.

FEDERALLY SPONSORED RESEARCH AND DEVELOPMENT

The Quantum Memory Device and Method is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 102361.

BACKGROUND

In order to advance the overall performance and efficiency of quantum computation technologies, including rapid single flux quantum (RSFQ) and quantum qubits, there is a need for improved memory/storage devices and methods that provide commensurate high density, low voltage, fast operation, and cryogenic compatibility.

DETAILED DESCRIPTION OF SOME EMBODIMENTS

Figure 1:
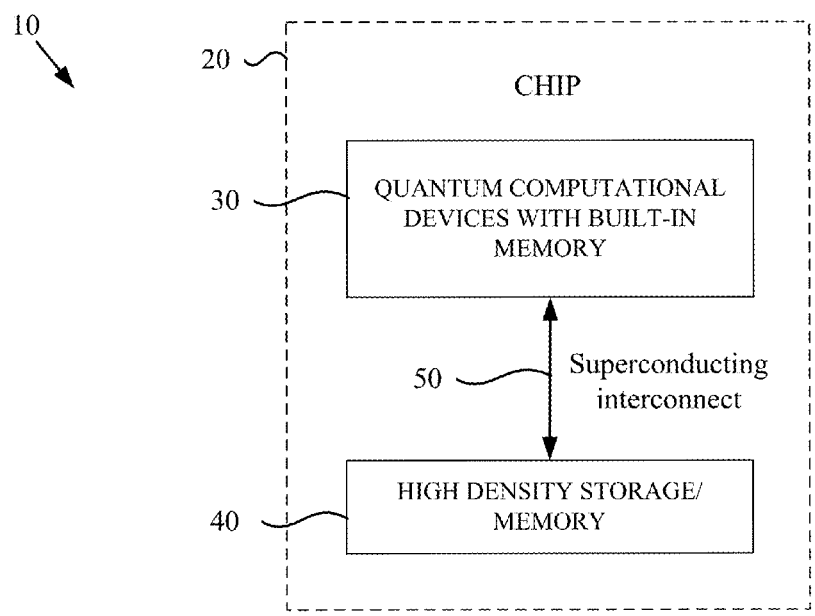
FIG. 1 shows a diagram illustrating a chip-scale computational architecture that may incorporate the Quantum Memory Device and Method.

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

Traditional memory devices have been designed for room temperature operation and utilization of the voltage levels required for charging/discharging from classical CMOS devices, >1V. There is a current challenge to design and research new memory devices specifically to meet the requirements of quantum computation. Designing memory devices specifically for quantum computation requires meeting a new set of requirements in speed, voltage, and temperature operation. Achieving all of these requirements simultaneously in a single device is a major challenge, solutions to which have included leveraging various devices including flash, magnetic RAM (MRAM) and resistive RAM (RRAM).

A main bottle neck to development of such memory has been due to physical constraints of the various approaches as well as material selections. Utilization of existing memory technologies for quantum computation has several drawbacks. Flash memory requires relatively elevated voltages (>3V) and microsecond-millisecond pulses to achieve the memory effect. DRAM and SRAM are volatile and require continuous voltage to refresh the state. There are also limitations on the overall scalability of the devices and the cryogenic compatibility due to the material systems utilized. MRAM also has limitations on the overall scalability (>25-30 nm) and integration with other cryogenic technology could be hampered by material integration requirements and the relatively large voltages and current densities required for switching. While RRAM potentially can achieve scalability, the typical (resistive processes) used for the memory effects require large voltage and, due to the use of conventional read processes, RRAM lacks sensitivity.

There is also a current challenge to develop memory devices that can operate with significant improvement in speed and that operate at reduced operating voltage in order to directly interface with quantum logic devices. Additionally, the devices should be capable of achieving the quantum confinement necessary for the generation and storage of well-protected quantum states. Such requirements call for new designs of quantum memory based on device structures that operate based on quantum processes operable at very low voltage and may require integration of superconductors. Further, there is a need for increased non-volatility and coherence time in order to mitigate the need for constant refreshing of either the conventional or quantum state. Increasing non-volatility also enables devices to be utilized for long term storage, extending the overall time window for computation and analysis.

Under unique conditions and harnessing the superconductor nature of the electrodes, a unique opportunity exists to tailor the Hamiltonian in order to generate, store, and protect the quantum states. Such a device may enable solid-state quantum memory to enable quantum computation and communication harnessing entanglement and superposition of states. While this is the ultimate goal, the technology can be utilized in more relaxed conditions (voltage/temperature/material) as a cryogenic memory for superconducting digital computation and/or as the key element for energy-efficient information storage devices.

The availability of a viable quantum memory device technology may enable chip architectures such as shown in FIG. 1. FIG. 1 shows a diagram illustrating a chip-scale computational architecture 10 that may incorporate the Quantum Memory Device and Method. As an example, architecture 10 may be incorporated on a single chip qubit/RSFQ device in close proximity to memory and high density nonvolatile memory/storage. Architecture 10 includes a semiconductor chip 20 including circuitry 30 comprising quantum computational devices with built-in memory connected to a high-density storage/memory 40 via a superconducting interconnect 50. As an example, circuitry 30 may comprise a plurality of superconductor-based Josephson junction (JJ) devices. Due to elimination of various lossy pathways, efficient qubit based quantum computation or RSFQ superconductor digital logic can be performed. The computational devices and high density memory/storage shown in FIG. 1 may be configured to operate with mV and ps signals.

It may be possible to integrate a quantum computational circuit with compatible built-in memory for with high speed digital logic or quantum information state processing. Because the architecture would be operated at a temperature where superconducting conditions are available, an interconnect may be constructed from 'lossless' superconducting material, further enabling a higher operating speed.

Embodiments disclosed herein provide a solid-state cryogenic compatible memory device where the writing, reading and erasing operations are performed, as an example, via fast (ps), low voltage (mV) electrical pulses that may be generated, for example, by on-chip computational devices. The embodiments involve a system and method that exploit strong electric-fields and quantum transport processes. The principles of operation for the memory effect is based on reversible electric field-induced ionic separation/transport process achieved in superconductor/barrier/ionic/barrier/superconductor (SBIBS) heterostructure devices.

As an example, the ionic transport is achieved via (MV/cm) electric fields generated across atomically layered heterostructures (e.g. $NbSe_2/NbS_{2-x}/NbSe_2$) and a net sheet ion density introduced of appropriate functional species at the interface of the sub-stoichiometric film to form an effective SBIBS structure. The SBIBS devices are optimized for the modification of the quantum transport and potential (Hamiltonian) profile where the ionic configuration is tuned by the applied electric field.

Figure 2:
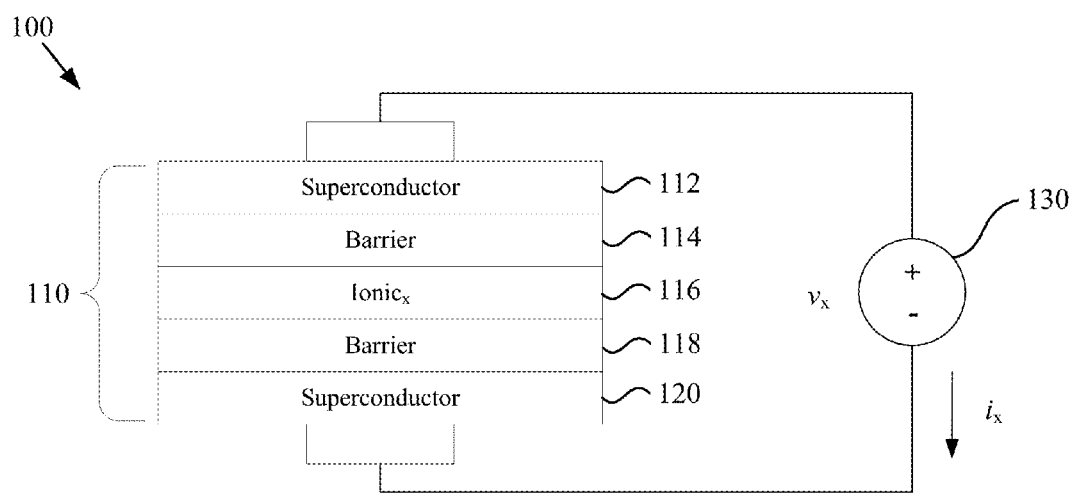
FIG. 2 shows a diagram illustrating the application of an input signal to an embodiment of a device in accordance with the Quantum Memory Device and Method.

FIG. 2 shows a diagram 100 illustrating the application of an input signal to an embodiment of a device in accordance with the Quantum Memory Device and Method, thus generating an electric field across the device. As shown, a superconductor-based device 110 is connected to a voltage source 130 having a voltage $v_x$. As an example, device 110 is a SBIBS device, including a superconductor layer 112, barrier layer 114, ionic layer 116, barrier layer 118, and superconductor layer 120.

Superconductor layers 112 and/or 120 may be configured to exhibit superconducting and/or metallic properties depending on the desired memory effect and temperature regime of operation (e.g. cryogenic). Superconductor layers 112 and/or 120 may also be configured to exhibit ferromagnetic properties if the desired memory effect subsequently requires a collective alignment of the spin-state of the selected ionic species. As an example, superconductor layers 112 and 120 may comprise materials such as $MgB_2$, $MgB_2/MgO$, NbN, Nb, YBCO, $NbN/Al-AlN_x$, and $Nb/Al-AlO_x$, where x may vary. Further, barrier layers 114 and 118 may comprise materials such as $AlO_x$, $NbSe_2/NbS_2$, $Nb/Cr_2O_3$, FeSe, or other materials as would be recognized by one having ordinary skill in the art.

Ionic layer 116 has a particular ionic configuration x, which causes device 110, when connected to voltage source 130, to produce a current $i_x$. Different configurations of ionic layer 116 produce different currents when a voltage is generated across device 110 by an input source, such as voltage source 130.

In some embodiments, the input signal comprises a voltage below a threshold voltage for inducing ion transport from ionic layer 116 across an ionic layer/barrier layer interface. In some embodiments, the input signal comprises a voltage above a threshold voltage for inducing ion transport within ionic layer 116. As is recognized by one having ordinary skill in the art, the specific threshold voltages vary depending upon the materials used. As an example however, the threshold voltage for a device constructed from atomic crystals can be an order of magnitude reduced than that constructed from conventional thin films due to significantly increased electric field. Utilization of band-offsets in a stack of atomic crystals can further reduce the threshold.

In some embodiments, the electric field generated across device 110 collectively alters the spin-states of the ions within ionic layer 116. For this to occur a suitable ferro-electric barrier film such as $Cr_2O_3$ or a Nickel/Iron alloy may be utilized along with the selection of an appropriate ionic species that could include amongst common elements or more advanced species including Nd, Pr, and Sm.

In some embodiments, the ion transport within ionic layer 116 comprises a tunneling ionization of ions. In some embodiments, the ion transport within ionic layer 116 comprises a transport of ions away from one of the first and second barrier layers 114 and 118, respectively.

In some embodiments, transport of ions within ionic layer 116 tunes the potential profile of the superconductor device. This is accomplished provided that the ionic transport exceeds the electric screening length which can be on the order of angstroms.

In some embodiments, the transport of ions within ionic layer 116 modulates the critical current of the superconductor device due to the high sensitive nature of quantum transport vis-à-vis tunneling of Cooper pairs on the overall potential energy profile that is sensitive to modification of the (Coulomb) potential via the ionic separation process.

FIGS. 3A-3D shows diagrams 200 illustrating the impact of read, write, and erase operations on an ionic layer within an embodiment of a memory device in accordance with the Quantum Memory Device and Method. As an example, the write/read/erase memory functions are achieved via low voltage pulses resulting in a reversible ionic transport of select ions away from the superconductor/barrier interface. The net conductivity via quantum transport (e.g. tunneling current) across device 110 defines reliable storage states reversible (hysteretic) behavior and tuning the effective Josephson effect critical current and sub-gap resistance while under superconducting conditions or altering the overall "resistive" state when operating under conventional non-superconducting conditions (e.g. at room temperature) via tunneling of conventional carriers.

Figure 3A:
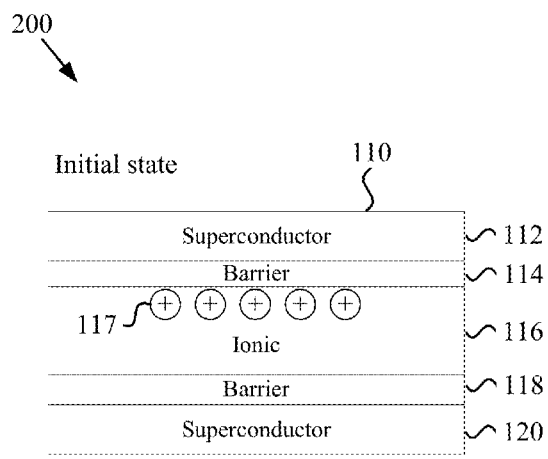
FIGS. 3A-3D show diagrams illustrating the impact of read, write, and erase operations on an ionic layer within an embodiment of a memory device in accordance with the Quantum Memory Device and Method.

FIG. 3A shows a diagram 200 of device 110 at an initial state, where ions 117 within ionic layer 116 are located near an ionic/barrier interface—namely an interface between barrier layer 114 and ionic layer 116. However, ions 117 may also be located near an interface between barrier layer 118 and ionic layer 116.

Figure 3B:
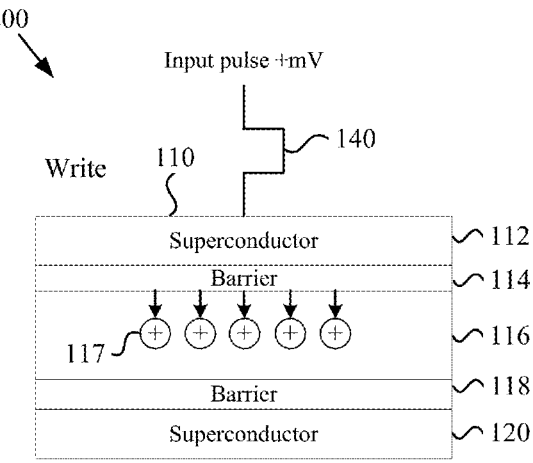

FIG. 3B shows a diagram 200 illustrating a memory write operation being performed using device 110. As shown, the memory write process is performed via the application of an input signal 140, such as a voltage pulse, across device 110, such that a sufficient electric field is generated to cause transport of ions away from the ionic/barrier interface, as shown by the arrows. Such transport results in an appreciable modulation of the potential profile and quantum coherence length and current density across device 110. In some embodiments, device 110 can be operated, for example with the application of voltage pulses with amplitude ranging from 20-150 mV, inducing an electric field strength on the order of $E_{write} = V_{write}/t_{ins}$, 0.1-1.0 MV/cm.

For appropriate ions with a typical velocity ranging from $2\text{-}5 \times 10^2$ m/s, the effective separation transit distance $d_{sep} = \tau_{sep} \times v_{ion}$ for a drift time of 1 ps is on the order of ~2-5 Ang., on the order of the typical bond length of the host crystal, providing for a relatively significant perturbation of the lattice structure and overall potential profile (Hamiltonian).

Figure 3C:
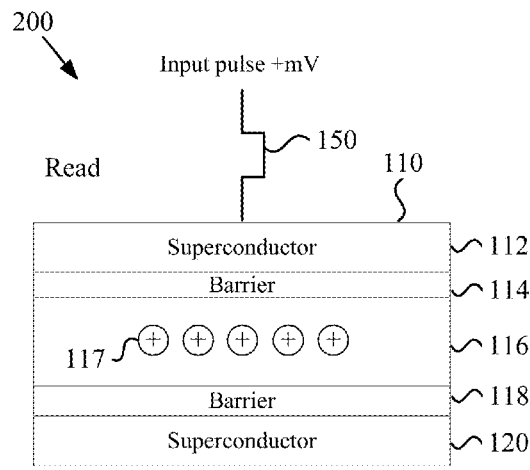

FIG. 3C shows a diagram 200 illustrating a memory read operation being performed using device 110, with device 110 initially in the state as shown in FIG. 3B. The read operation is determined by probing the total conductivity state of the film stack and correlating with the degree of ionic separation under low field conditions that do not further alter the ionic configuration. The read process may occur via application of an input signal 150, such as a low voltage pulse, sufficient to detect the critical current state, but below the threshold for achieving any additional ionic transport. As such, the read operation may performed by applying a voltage pulse with amplitude below the critical field required to induce ionic separation, where $E_{read} < E_{write}$, and measuring the resistive state of the junction.

Figure 3D:
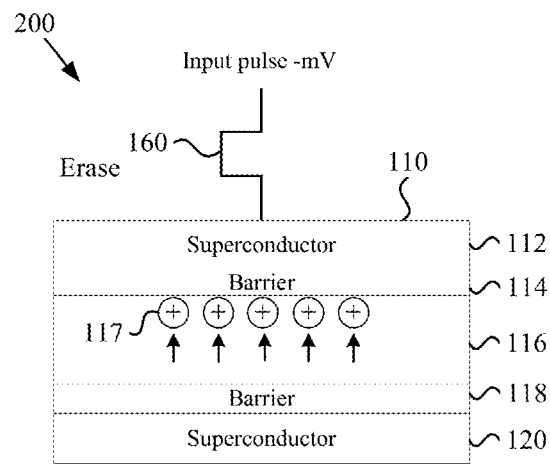

FIG. 3D shows a diagram 200 illustrating a memory erase operation being performed using device 110, with device 110 initially in the state as shown in FIG. 3C. The erase process is performed by applying an input signal 160, such as a voltage pulse of the opposite polarity of the write process, to transport the ions back to original configuration at the ionic/barrier interface and return the critical current back to pre-programmed conditions. With application of the appropriate reverse polarity voltage, the ionic separation process can be repeatedly reversed with strong endurance. The physical nature of the ionic separation process allows for the memory effect to be non-volatile and for the stored state to be retained without persistent application of a voltage bias.

Due to the high sensitive nature of quantum transport vis-à-vis tunneling of Cooper pairs on the overall potential energy profile that is sensitive to modification of the (Coulomb) potential via the ionic separation process, there is appreciable modulation of the overall superconductor critical current. In the cryogenic regime, where the constituent films behave as superconductors, the resulting current can exhibit Josephson effects that are controllably damped due to the degree of ionic separation in the barrier region.

In addition, the potential profile (and effective Hamiltonian) are tuned to provide for a platform to generate and store quantum information states for quantum computation and communication purposes. Variations of the structure are implemented to achieve the tunable profiles for implementation of a particular quantum algorithm. In the non-superconducting state (e.g. room temperature) the device can also be utilized as a conventional high performance non-volatile memory device where the ionic transport process across the device generates conductance (resistance) modulation. This utility is also useful for implementing digital superconducting logic based on rapid single flux quantum pulses.

Where control of the (magnetic) spin-state is necessary, the barrier material and ionic species are appropriately selected to produce the desired spin-ordering properties. Realization of the proper structures to achieve the SBIBS device concept requires overcoming several challenges at both the material and device level to include development of advanced thin films, techniques for ionic modification, construction of high-quality devices and development of characterization protocols.

Figure 4A:
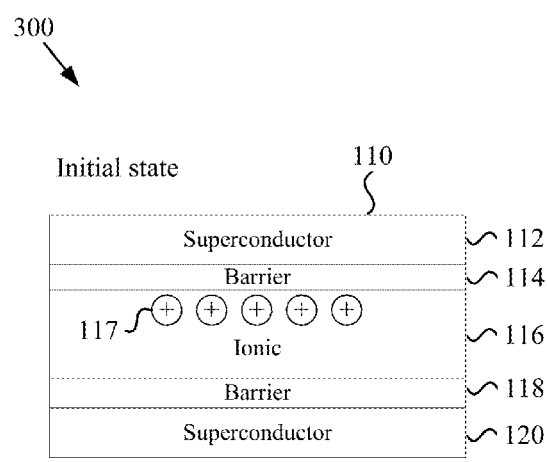
FIGS. 4A-4B show diagrams illustrating the movement of ions from an ionic layer to a barrier layer in response to an input signal in accordance with an embodiment of a memory device in accordance with the Quantum Memory Device and Method.
Figure 4B:
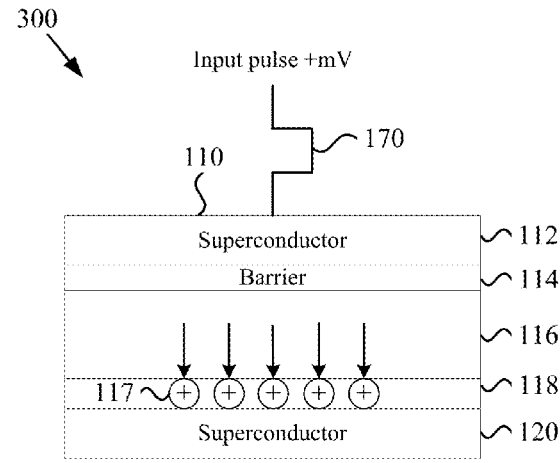

FIGS. 4A-4B show diagrams illustrating the movement of ions from an ionic layer to a barrier layer in response to an input signal in accordance with an embodiment of a memory device in accordance with the Quantum Memory Device and Method. FIG. 4A shows a diagram 300 of device 110 at an initial state, where ions 117 within ionic layer 116 are located near an ionic/barrier interface—namely an interface between barrier layer 114 and ionic layer 116. However, ions 117 may also be located near an interface between barrier layer 118 and ionic layer 116.

FIG. 4B shows a diagram 300 illustrating the movement, as shown by the arrows, of ions 117 from ionic layer 116 to barrier layer 118 in response to an input signal 170, such as a voltage pulse, across device 110. Input signal 170 comprises a voltage greater than a threshold voltage for inducing ion transport from ionic layer 116 across an ionic layer/barrier layer interface, such as the interface between ionic layer 116 and barrier layer 118. As would be recognized by one having ordinary skill in the art, the threshold voltage level may vary depending, in part, upon the materials used in ionic layer 116 and barrier layer 118. As an example, the operation performed in FIG. 4B may be a write process. As a further example, the ion transport from ionic layer 116 across the ionic layer/barrier layer interface may comprise quantum coherent ionic transport, Josephson tunneling, or resonant tunneling.

Figure 5A:
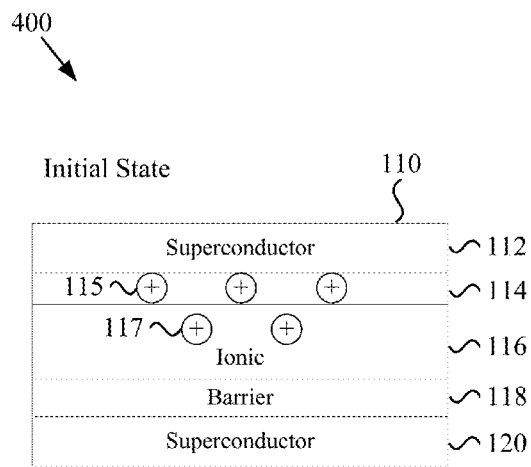
FIGS. 5A-5B show diagrams illustrating the movement of select ions from an ionic layer to a barrier layer in response to an input signal in accordance with an embodiment of a memory device in accordance with the Quantum Memory Device and Method.
Figure 5B:
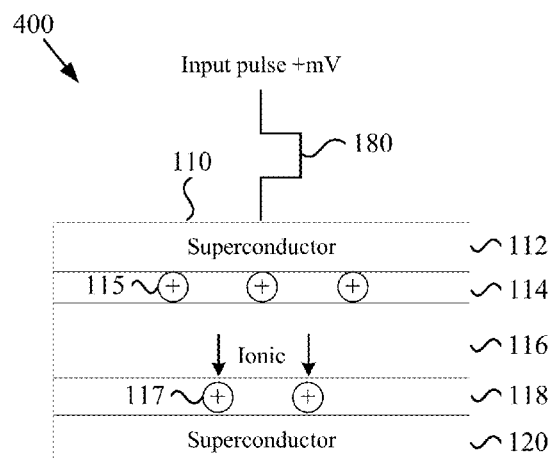

FIGS. 5A-5B show diagrams illustrating the movement of select ions from an ionic layer to a barrier layer in response to an input signal in accordance with an embodiment of a memory device in accordance with the Quantum Memory Device and Method. FIG. 5A shows a diagram 400 of device 110 at an initial state, where ions 115 are located within barrier layer 114 and ions 117 are located within ionic layer 116. As an example, ions 117 are located near an ionic/barrier interface—namely an interface between barrier layer 114 and ionic layer 116. However, ions 117 may also be located near an interface between barrier layer 118 and ionic layer 116.

FIG. 5B shows a diagram 400 illustrating the movement, as shown by the arrows, of ions 117 from ionic layer 116 to barrier layer 118 in response to an input signal 180, such as a voltage pulse, across device 110. As an example, the operation performed in FIG. 5B may be a write process. Input signal 180 comprises a voltage greater than a threshold voltage for inducing ion transport of ions 117 from ionic layer 116 across the ionic layer/barrier layer interface between ionic layer 116 and barrier layer 118. Input signal 180 is also selected such only ions 117 are targeted for movement and such that ions 115 are not affected by input signal 180 and remain within barrier layer 114. As an example, input signal 180 would not be above the threshold voltage level for inducing transport of ions 115 across the interface between barrier layer 114 and ionic layer 116. As would be recognized by one having ordinary skill in the art, the specific threshold voltage level required for specific ionic movement may vary depending, in part, upon the materials used in device 110.

Depending upon the input signal used, ions from any layer of device 110 may be transported to any other layer of device 110. For example, ions from barrier layers 114 and 118 and/or ions from ionic layer 117 may be transported to either or both of superconductor layers 112 and 120, or vice versa. As an example, the ion transport between the various layers within device 110 may comprise quantum coherent ionic transport, Josephson tunneling, or resonant tunneling.

In the SBIBS device design, a key physical property is the electric-field induced transport of ions across the barrier film. There is a balance between both applied electric field induced drift of ions which largely determine the write/erase processes and an intrinsic diffusion or relaxation that largely determines the retention time of the memory state. A strong determinant of both of these processes is the potential barrier of the ions with respect to the host matrix. At high electric fields, non-linear ionic drift occurs that significantly reduces the total write time. Due to a balance between optimal write and retention times, typically a nominally large potential barrier must be engineered for room temperature operation with resistive materials, hence requiring an operational voltage of, for example, greater than 2V.

In embodiments disclosed herein, superconductor electrodes are incorporated, enabling quantum coherent transport to occur across the device via Josephson tunneling (Cooper pair and quasiparticle-based). Further, the effects of low cryogenic temperature on the non-linear ion transport are exploited. Calculations demonstrate that at low temperature a suitable potential barrier should be selected as described in the diagram shown in FIG. 6 to provide both fast write/erase times while maintaining a sufficient retention time due to the reduction in diffusive relaxation processes at cryogenic conditions. At low temperature, there is a requirement to operate at relatively large electric fields, such as greater than 0.1 MV/cm, to achieve the desired ion transport across the length of the device, which is attainable in ultra-thin films and heterostructures at the designated low voltage.

Figure 6:
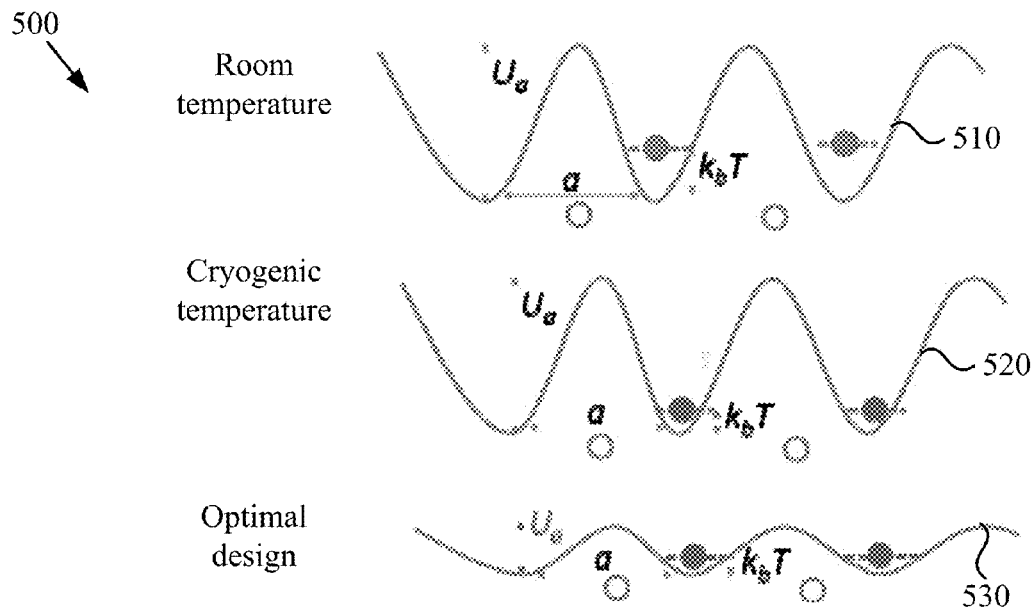
FIG. 6 shows a diagram illustrating crystal lattice and point-ions configurations for a device operating at room temperature, cryogenic temperature, and an optimal design in accordance with the Quantum Memory Device and Method.

FIG. 6 shows a diagram 500 illustrating crystal lattice and point-ions configurations for a device operating at room temperature, cryogenic temperature, and an optimal design in accordance with the Quantum Memory Device and Method. Line 510 represents the behavior pattern at room temperature, line 520 represents the behavior pattern at cryogenic temperature, and line 530 represents an optimal design, which favors both fast write speeds and long retention times under cryogenic conditions. The velocity of ions in the thin films can be described according to the point-ion models by the nonlinear expression:

$$v \approx fae^{-\frac{U_a}{k_bT}} \sinh\left(\frac{qEa}{2k_BT}\right) \quad \text{(Eq. 1)}$$

where $U_a$ is the activation energy for ion hopping, f is the frequency of hops, a is the periodicity of the arranged ions, and E is the electric-field. In the expression for velocity, the key determinants for achieving a high ion velocity are high electric fields while maintaining a small activation energy. While reduction in temperature effectively results in a reduction in the ionic transport velocity, the effect can be balanced by an enhanced velocity achieved via strong fields and engineering the appropriate $U_a$, as shown in FIG. 6.

Figure 7:
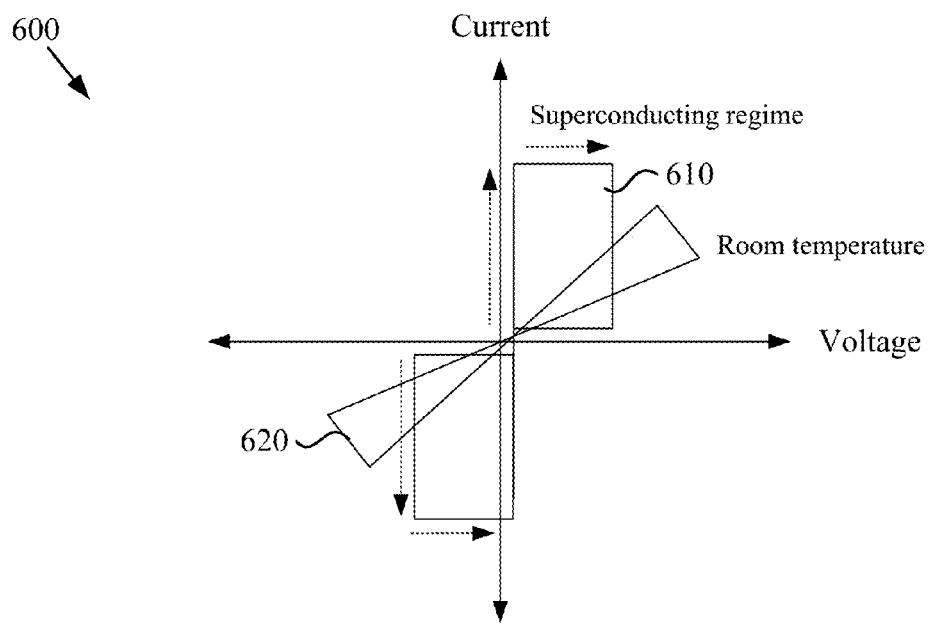
FIG. 7 shows a diagram illustrating the current-voltage characteristics in the quantum transport regime in accordance with the Quantum Memory Device and Method.

FIG. 7 shows a diagram 600 illustrating the current-voltage characteristics in the quantum transport regime in accordance with the Quantum Memory Device and Method. Region 610 represents the current-voltage characteristics in the superconducting regime (e.g. due to cryogenic Josephson tunneling), while region 620 represents the current-voltage characteristics at room temperature. FIG. 7 demonstrates persistent non-volatile and reversible memory effects for both cryogenic and room temperature.

Figure 8:
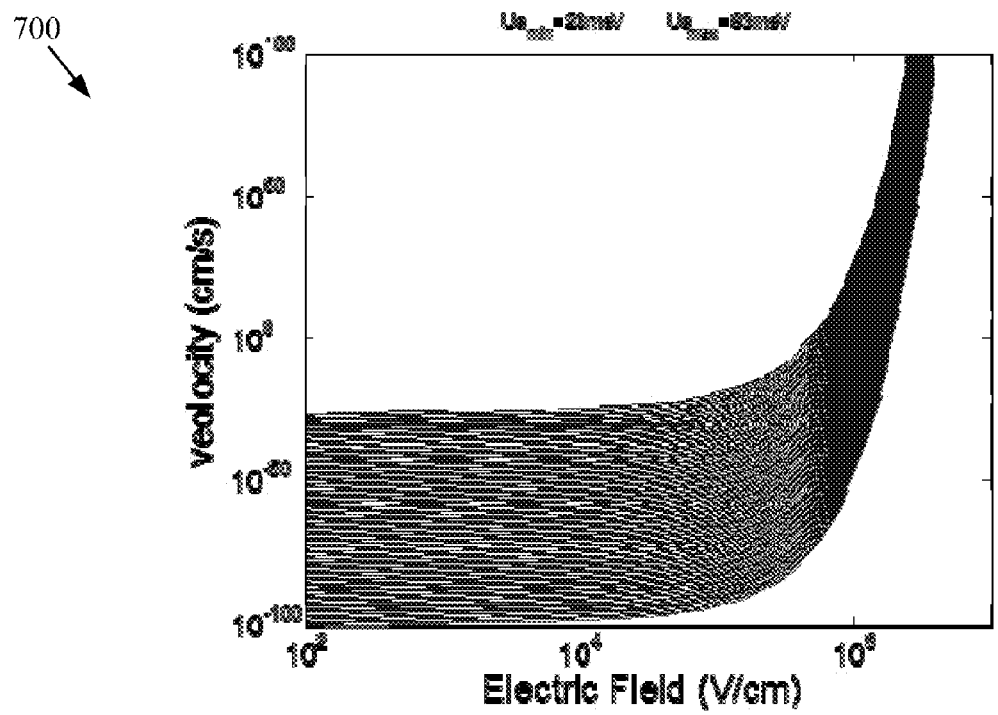
FIG. 8 shows a graph illustrating ion velocity versus electric field for a range of barrier potential activation energies in accordance with the Quantum Memory Device and Method.

FIG. 8 shows a graph 700 illustrating ion velocity versus electric field for a range of barrier potential activation energies in accordance with the Quantum Memory Device and Method. There is enhanced non-linear increase in ion-velocity for electric fields attainable in devices with thin film. From the ion transport velocity, the switching speed or write time of the device can be expressed as $$\tau_{write} \approx \frac{L}{v} \quad \text{(Eq. 2)}$$

where L is the required device (transport) length and v is the ion velocity. Once programmed, the device will lose its state in $$\tau_{store} \approx \frac{L^2}{D} \quad \text{(Eq. 3)}$$

where D is the diffusion constant for a loss of the stored state due to diffusion.

The ratio of volatility/switching speed ratio can be expressed based on the Ernst diffusion by the equation $$\frac{\tau_{store}}{\tau_{write}} \approx \frac{q}{k_b T} EL \quad \text{(Eq. 4)}$$

Figure 9:
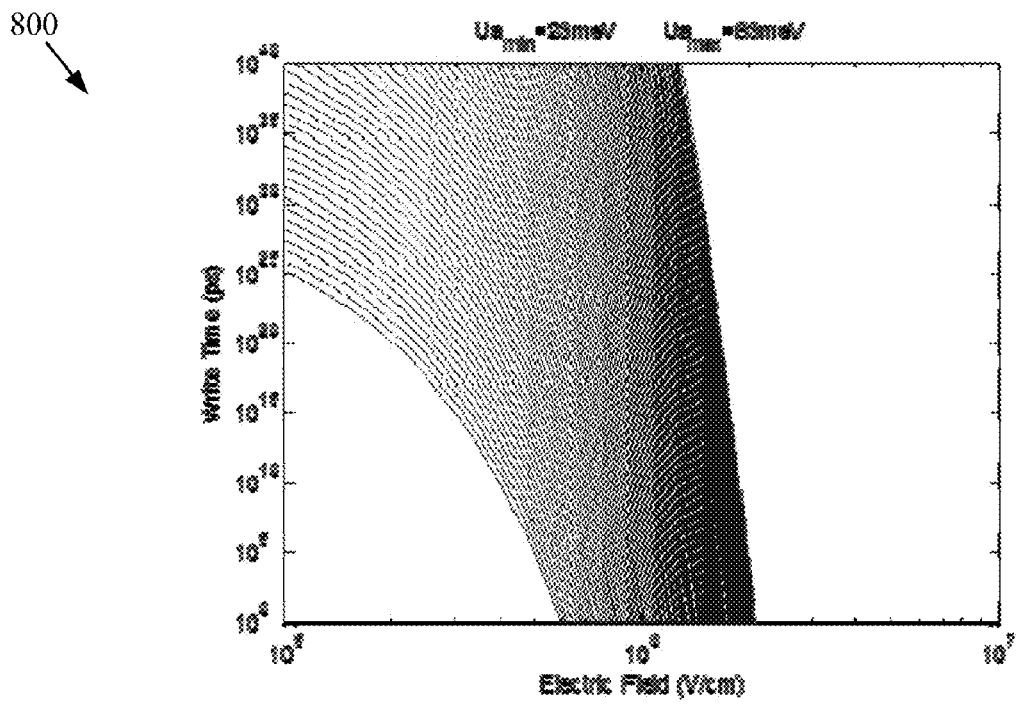
FIG. 9 shows a graph illustrating calculated memory write time of an ionic configuration versus electric field for a range of ionic activation energies in accordance with the Quantum Memory Device and Method.

FIG. 9 shows a graph 800 illustrating calculated memory write time of an ionic configuration versus electric field for a range of ionic activation energies spanning from 23 meV to 83 meV in accordance with the Quantum Memory Device and Method. FIG. 9 demonstrates that fast (e.g. ps) write time and long (e.g. greater than 10 year) storage is achievable with field while electric fields required for reading will not disrupt the ionic configuration.

The critical current of a Josephson junction is a strong function of the properties of both of the superconductor electrodes, the barrier material, the details of the superconductor/barrier interface, and the effect of any embedded films or ions in the regions across the length of the device. Additionally, due to the so-called quantum proximity effect, the physics is affected by the constituent properties internal to the electrodes and the degree of transparency. Due to the sensitivity of the critical current and energy profile based on the device design, there is a physical mechanism to design superconductive memory devices. The requirement is a transduction effect that results on a modification of the effective properties of the constituent components of the device. Electric and magnetic fields provided, for example, by a voltage applied across the device, is an effective transduction method to result in modification of electronic/magnetic/ionic configuration across the device.

A mechanism for controlling the critical current and potential (Hamiltonian) profile involves tuning the quantum transport "coherence length" based on the ionic concentration and position with respect to the superconductor/barrier interface. The expression for coherence length $\xi_n$ for a normal metal barrier is $$\xi_n = \left(\frac{D}{k_B T} \frac{\hbar}{2\pi}\right)^{1/2} \quad \text{(Eq. 5)}$$

where $\hbar$ is the reduced Planck's constant, the diffusion constant $$D = \left(\frac{1}{3}\right) v_F l_n$$

with $v_F$ the Fermi velocity and $l_n$ the mean free path in the normal material, $k_B$ is the Boltzmann constant, and T is the temperature. The critical current $I_c$ is expressed as:

$$I_c = \frac{4A}{\pi e \rho_n} \frac{|\Delta|^2}{k_B T_c \xi_n} e^{-\frac{L}{\xi_n}} \quad \text{(Eq. 6)}$$

where $\rho_n$ is the resistivity of the barrier material, $\Delta$ the sum-gap voltage and A is the cross-sectional area.

Figure 10:
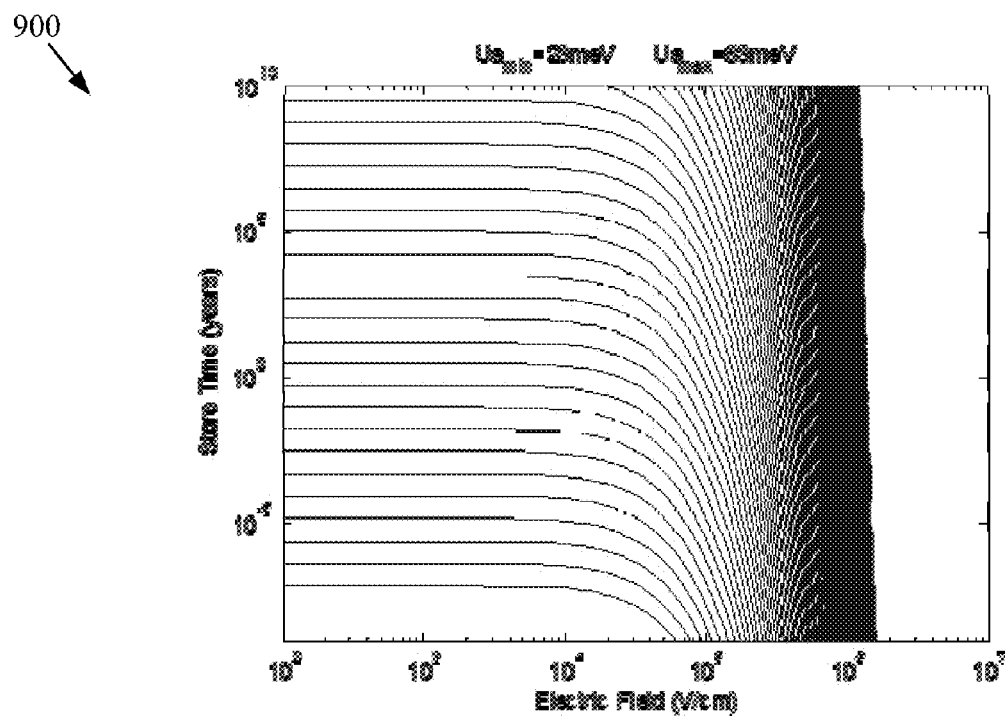
FIG. 10 shows a graph illustrating calculated memory storage time of an ionic configuration versus electric field for a range of ionic activation energies in accordance with the Quantum Memory Device and Method.

FIG. 10 shows a graph 900 illustrating calculated memory storage time of an ionic configuration versus electric field for a range of ionic activation energies spanning from 23 meV to 83 meV in accordance with the Quantum Memory Device and Method. The graph demonstrates strong retention with the application of a nominal electric field to be utilized for the read process. The graph shows a range of designs based on the desired storage time ranging from a few seconds to many years if required.

Figure 11:
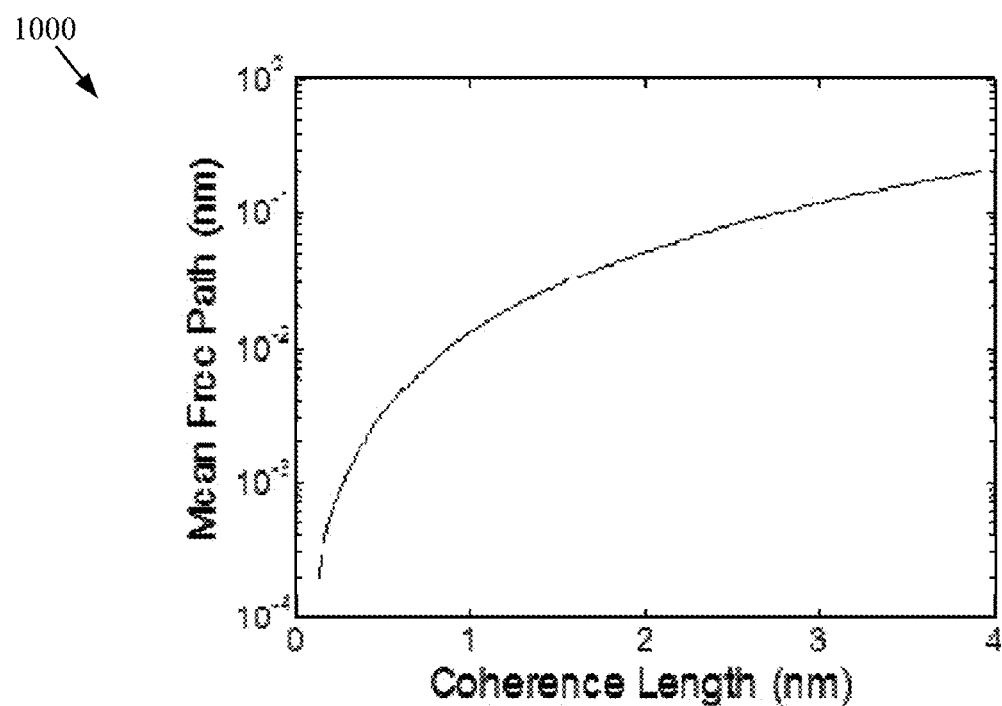
FIG. 11 shows a graph illustrating mean free path versus quantum coherence length for one embodiment of a device in accordance with the Quantum Memory Device and Method.

FIG. 11 shows a graph 1000 illustrating mean free path versus quantum coherence length for one embodiment of a device in accordance with the Quantum Memory Device and Method. To demonstrate the utility of the device design, the graph demonstrates the effect of barrier material selection vis-à-vis the quantum coherence length on the mean free path.

Figure 12:
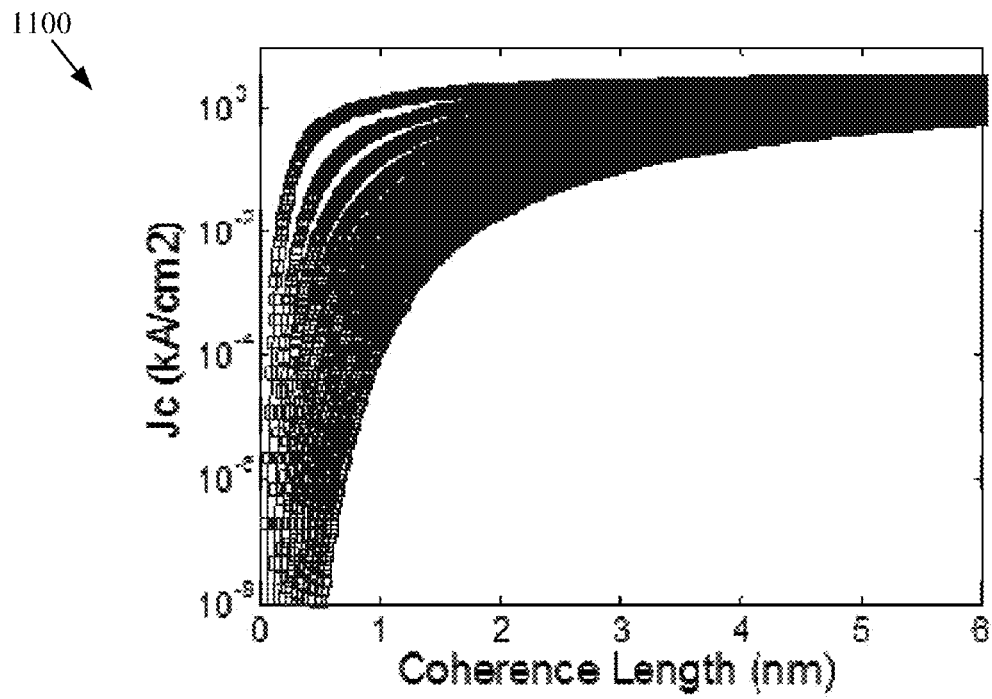
FIG. 12 shows a graph illustrating the critical current density versus quantum coherence length for a range of mean free path for one embodiment of a device in accordance with the Quantum Memory Device and Method.

FIG. 12 shows a graph 1100 illustrating the critical current density $J_c$ versus quantum coherence length for a range of mean free path for one embodiment of a device in accordance with the Quantum Memory Device and Method. FIG. 12 demonstrates orders of magnitude of tuning with modest modulation of the coherence length enabled by modulation of the mean-free-path. The expressions demonstrate the effect of altering the barrier material properties on the superconductive properties.

The expressions above relate the constituent materials properties to the overall properties. Alternatively, expressions have been derived for the coherence limit and critical current dependencies for metal-like barrier films with an arbitrary charge density which is a good approximation to the configuration with a sheet charge of ions that alters an effective Schottky barrier at the interface between the superconductor and the barrier. These expressions allow for relating the density of ions to the critical current and coherence length by integrating the expression across the depth of the device length, yielding:

$$\xi_i = \int_{x=0}^{x=2a} \left(\frac{\hbar^3 \mu(x)}{6\pi e k_B T m^*(x)}\right)^{1/2} (3\pi^2 n_{ion}(a))^{1/3} dx \quad \text{(Eq. 7)}$$

where $\mu(x)$ is the position dependent mobility, $m^*(x)$ effective mass, $n_{ion}(a)$ is the charged ion density, and 2a is the device length. Note that due to the ability to tune the position and density of ions embedded in the barrier material, there is effective tuning of the effective coherence length and consequently a measurable quantity such as the critical current density. Additionally, the position dependent potential energy profile across the device is tunable.

Figure 13:
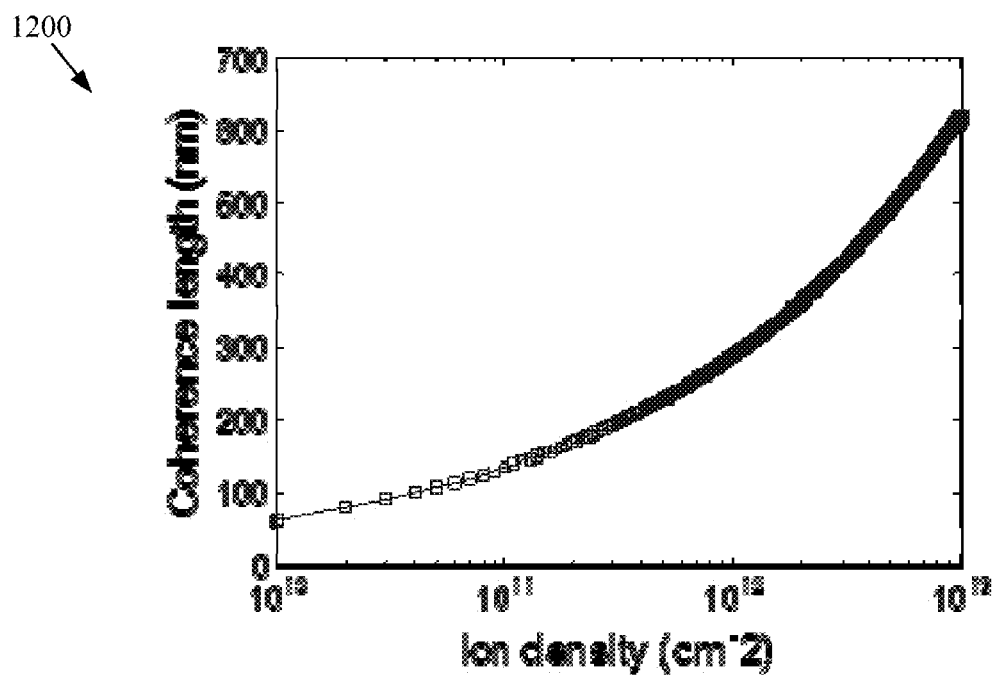
FIG. 13 shows a graph illustrating quantum coherence length versus ion density for one embodiment of a device in accordance with the Quantum Memory Device and Method.
Figure 14:
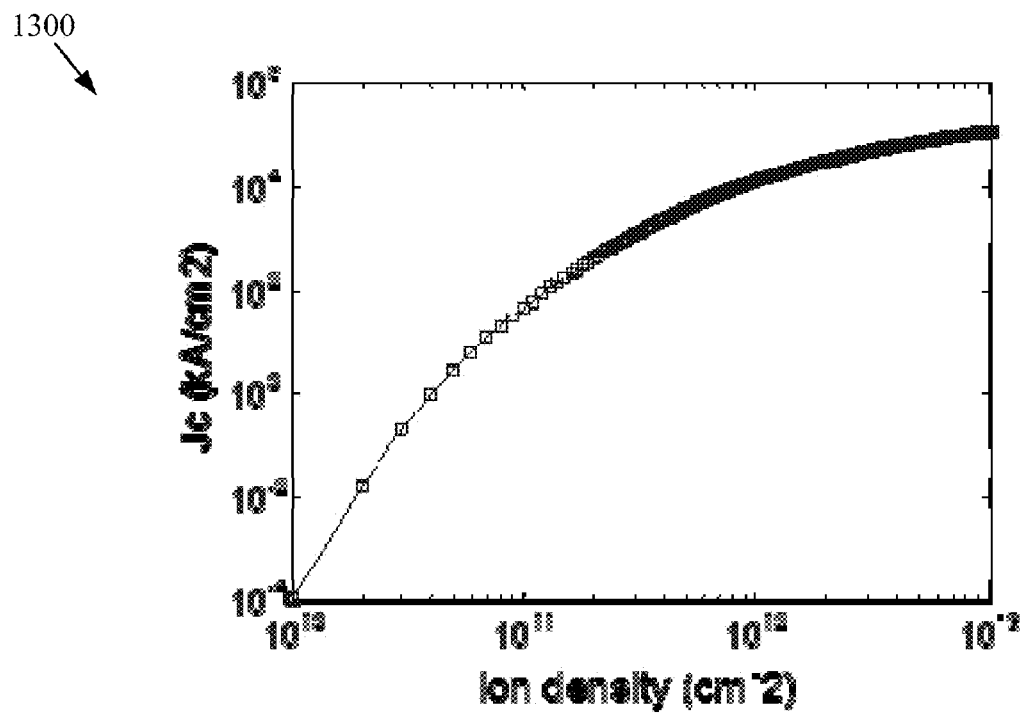
FIG. 14 shows a graph illustrating critical current density versus ion density for one embodiment of a device in accordance with the Quantum Memory Device and Method.
Figure 15:
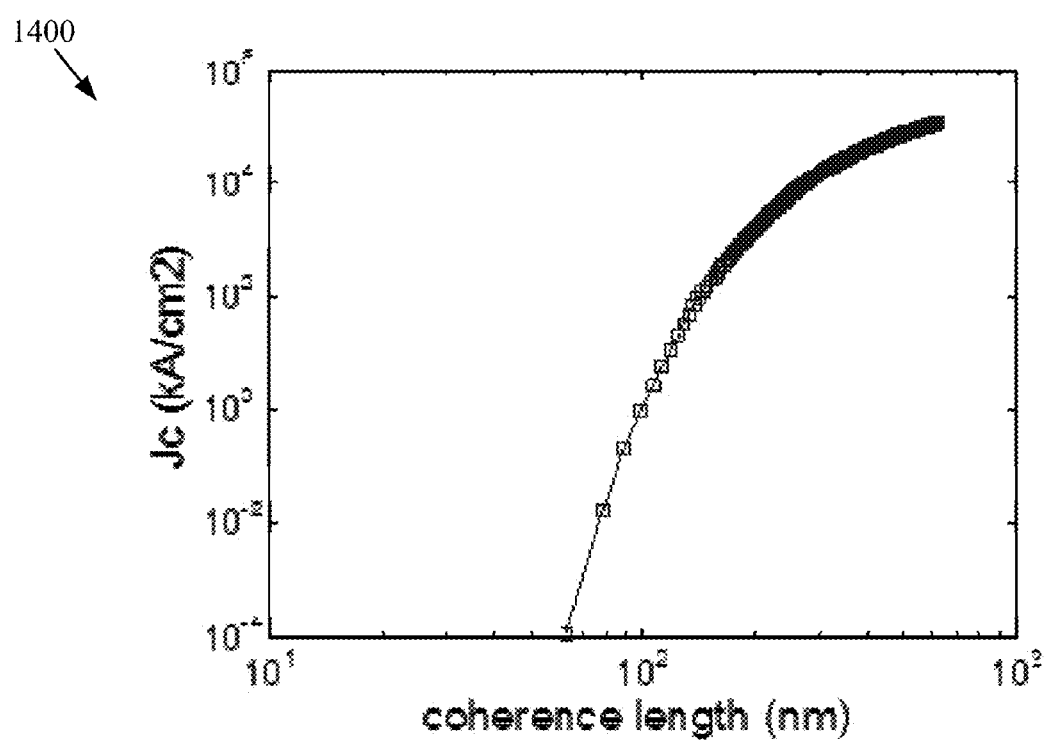
FIG. 15 shows a graph illustrating critical current density versus quantum coherence length for one embodiment of a device in accordance with the Quantum Memory Device and Method.

FIGS. 13-15 show graphs illustrating the effect of ion density on the coherence length and critical current for an embodiment of a device in accordance with the Quantum Memory Device and Method, demonstrating capability for wide tenability. FIG. 13 shows a graph 1200 illustrating quantum coherence length versus ion density, FIG. 14 shows a graph 1300 illustrating critical current density versus ion density, and FIG. 15 shows a graph 1400 illustrating critical current density versus quantum coherence length demonstrating strong correlation between the ion density and critical current vis-à-vis effective modulation of the coherence length.

The superconducting quantum tunneling current across the SBIBS device is utilized as a means of sensing the memory state. This ability is useful as the Josephson effect in an adjacent 'logic' device can also be utilized to generate the fast, low-voltage pulses required to achieve the desired ionic transport. In addition, the electrostatic potential profile of the device can be utilized to generate the required potential well for the generation of a two-level quantum state system for performing quantum computations.

Effectively, the impact of ions is a net modification of the ideality of the device. It is therefore possible to relate the effect of non-ideality such as embedding ions to the overall current voltage response. An empirical model has been developed to describe the current-voltage characteristics with a free-fitting parameter that describes the overall ideality. The expression is calibrated to measurements in the literature of devices based on several materials and the model is used to describe the characteristics of a SBIBS device.

Figure 16:
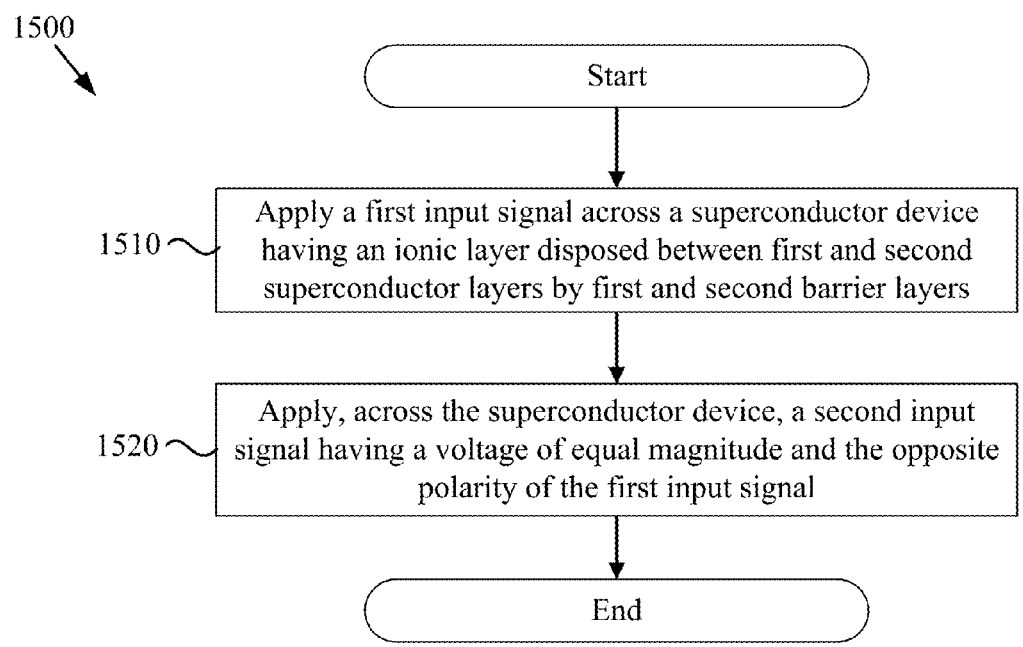
FIG. 16 shows a flowchart of an embodiment of a method in accordance with the Quantum Memory Device and Method.

FIG. 16 shows a flowchart of an embodiment of a method 1500 in accordance with the Quantum Memory Device and Method. For illustrative purposes, method 1500 will be discussed with reference to device 110 shown in FIGS. 2 and 3A-3D. While FIG. 16 shows one embodiment of method 1500 to include steps 1510-1520, other embodiments of method 1500 may contain fewer or more steps. Further, while in some embodiments the steps of method 1500 may be performed as shown in FIG. 16, in other embodiments the steps may be performed in a different order, or certain steps may occur simultaneously with one or more other steps.

Method 1500 begins at step 1510, which involves applying a first input signal, such as signal 140, across a superconductor device, such as device 110 having an ionic layer 116 disposed between first and second superconductor layers 112 and 120 by first and second barrier layers 114 and 118. Step 1520 then involves applying, across the superconductor device 110, a second input signal, such as signal 160, having a voltage of equal magnitude and the opposite polarity of the first input signal.

Various storage media, such as magnetic computer disks, optical disks, and electronic memories, as well as non-transitory computer-readable storage media and computer program products, can be prepared that can contain information that can direct a device, such as a micro-controller, to implement the above-described systems and/or methods. Once an appropriate device has access to the information and programs contained on the storage media, the storage media can provide the information and programs to the device, enabling the device to perform the above-described systems and/or methods.

For example, if a computer disk containing appropriate materials, such as a source file, an object file, or an executable file, were provided to a computer, the computer could receive the information, appropriately configure itself and perform the functions of the various systems and methods outlined in the diagrams and flowcharts above to implement the various functions. That is, the computer could receive various portions of information from the disk relating to different elements of the above-described systems and/or methods, implement the individual systems and/or methods, and coordinate the functions of the individual systems and/or methods.

Many modifications and variations of the Quantum Memory Device and Method are possible in light of the above description. Within the scope of the appended claims, the embodiments of the systems described herein may be practiced otherwise than as specifically described. The scope of the claims is not limited to the implementations and the embodiments disclosed herein, but extends to other implementations and embodiments as may be contemplated by those having ordinary skill in the art.

We claim:

1. A method comprising the steps of:
applying an input signal to a superconductor device to generate an electric field across the superconductor device, the superconductor device comprising an ionic layer disposed between and separated from first and second superconductor layers by respective first and second barrier layers, wherein the input signal comprises a voltage below a threshold voltage for inducing ion transport from the ionic layer across an ionic layer/barrier layer interface.

2. The method of claim 1, wherein the input signal is applied to the superconductor device when the superconductor device is in a superconducting state.

3. The method of claim 1, wherein the electric field generated across the superconductor device collectively alters the spin-states of the ions within the ionic layer.

4. The method of claim 1, wherein the input signal comprises a voltage above a threshold voltage for inducing ion transport within the ionic layer.

5. The method of claim 4, wherein the ion transport within the ionic layer comprises a tunneling ionization of ions.

6. The method of claim 4, wherein the ion transport within the ionic layer comprises a transport of ions away from one of the first and second barrier layers.

7. The method of claim 6, wherein transport of ions within the ionic layer tunes the potential profile of the superconductor device.

8. The method of claim 6, wherein the transport of ions within the ionic layer modulates the critical current of the superconductor device.

9. The method of claim 3, wherein the input signal comprises a voltage below a threshold voltage for inducing ion transport within the ionic layer.

10. A method comprising the steps of:
applying an input signal to a superconductor device to generate an electric field across the superconductor device, the superconductor device comprising an ionic layer disposed between and separated from first and second superconductor layers by respective first and second barrier layers, wherein the input signal comprises a voltage greater than a threshold voltage for inducing ion transport from the ionic layer across an ionic layer/barrier layer interface.

11. The method of claim 10 further comprising the step of applying a second input signal to the superconductor device, wherein the second input signal comprises a voltage having equal magnitude and the opposite polarity of the input signal.

12. The method of claim 10, wherein the ion transport from the ionic layer across the ionic layer/barrier layer interface comprises quantum coherent ionic transport.

13. The method of claim 10, wherein the ion transport from the ionic layer across the ionic layer/barrier layer interface comprises Josephson tunneling.

14. The method of claim 10, wherein the ion transport from the ionic layer across the ionic layer/barrier layer interface comprises resonant tunneling.

15. The method of claim 10, wherein the input signal is applied to the superconductor device when the superconductor device is in a superconducting state.

16. The method of claim 10, wherein the electric field generated across the superconductor device collectively alters the spin-states of the ions within the ionic layer.

17. The system of claim 16, wherein the species of ions in the ionic layer and the material of the first and second barrier layers are selected to produce desired spin-ordering properties.

18. A system comprising:
an ionic layer disposed between and separated from first and second superconductor layers by respective first and second barrier layers, wherein the first and second barrier layers each comprise one of a ferromagnetic, ferroelectric, and multi-ferroic material.

19. The system of claim 17 further comprising circuitry configured to apply a voltage signal to the superconductor device to generate an electric field across the superconducting device.

20. The system of claim 19, wherein the voltage signal comprises a voltage that is both below a threshold voltage for inducing ion transport from the ionic layer across an ionic layer/barrier layer interface and above a threshold voltage for inducing ion transport within the ionic layer.

* * * * *